United States Patent [19]

Woo

[11] Patent Number: 4,930,037
[45] Date of Patent: May 29, 1990

[54] INPUT VOLTAGE PROTECTION SYSTEM

[75] Inventor: Ann K. Woo, Cupertino, Calif.

[73] Assignee: Advaced Micro Devices, Inc., Sunnyvale, Calif.

[21] Appl. No.: 311,270

[22] Filed: Feb. 16, 1989

[51] Int. Cl.$^5$ .............................................. H02H 3/20
[52] U.S. Cl. ........................................ 361/58; 361/91; 361/111; 357/23.13
[58] Field of Search ................. 357/23.13; 361/58, 91, 361/111

[56] References Cited
U.S. PATENT DOCUMENTS
3,947,727  3/1976  Steuart ............................. 357/23.13

Primary Examiner—Todd E. DeBoer
Attorney, Agent, or Firm—Salzman & Levy

[57] ABSTRACT

A static electricity protection system for use with a voltage sensitive MOS component having a gate input including a layer of oxide. A transmission gate having a source and a drain as an input and output, respectively, is connected to the MOS component gate input for protecting it from sudden electrical voltage surge discharges. The transmission gate source and drain include a layer of oxide substantially thicker than the oxide layer of the MOS component gate input.

8 Claims, 2 Drawing Sheets

INPUT VOLTAGE PROTECTION SYSTEM

BACKGROUND OF THE INVENTION

The present invention relates to a system for protecting electrical semiconductor components and circuits utilizing them from inadvertent connection or exposure to high voltage surges and more particularly to a system for protecting MOS components from excessive levels of transient voltage.

Insulated gate field effect transistors, sometimes called IGFETs, are well known and widely used in the semiconductor art, both as discrete devices and as components of integrated circuits. Such devices usually include, in a semiconductor body such as silicon, a source region and a drain region separated from the source region by a channel region. Current flow through the channel, between source and drain, is controlled by a gate electrode physically separated from the channel by an insulative layer. The gate is capacitively coupled to the channel through the insulative layer, which serves as the capacitor dielectric, and voltage signals applied to the gate determine whether current flow through the channel is turned ON (increased) or turned OFF (diminished).

In an IGFET of, for example, silicon semiconductor material, and when the insulative material between the gate electrode and the channel in the silicon is an oxide of silicon or a material including as a significant portion an oxide of silicon, the term "MOS" (Metal-over-Oxide-over-Silicon) is often used. MOS describes the three layered structure constituted by the gate electrode of metal (or other suitable electrically conductive material such as low resistivity polycrystalline silicon) overlying the oxide insulative layer, which in turn overlies the channel. By extension, the term NMOS is conventionally used to mean an IGFET of the MOS type wherein the source and drain regions are of N-type conductivity and the channel region between source and drain is converted to N-type conductivity responsive to the gate signal so as to promote conduction through the channel between source and drain. Also, the term PMOS is conventionally applied to MOS structures wherein the source and drain regions are usually of P-type conductivity. The term CMOS, or Complimentary MOS, is conventionally applied to products wherein both NMOS and PMOS devices are cooperatively utilized.

Performance of such devices, in terms for example of desirably increased speed of response to an applied gate signal, and desirably reduced amplitude of gate signal voltage necessary to produce an intended effect on current flow through the channel, is enhanced by decreasing the thickness of the insulative layer physically separating and capacitively coupling the gate and the channel. Consequently such insulative layers are normally made quite thin, on the order of a few hundreds of angstroms in thickness.

MOS components are relatively sensitive, delicate objects, susceptible to damage due, among other things, to physical handling, thermal shock and electrical shock. Both human handling (placement, shipment and the like) as well as automatic handling equipment can be responsible for such damage, when it occurs.

In the fields of physical handling and thermal shock, absorbant packaging and insulating materials, respectively, can alleviate the problems. Electrical hazards, however, pose a different and somewhat more vexing problem.

The most dangerous and unpredictable type of static electricity damage can occur when a human comes into contact with a MOS component. In that case, a high voltage surge can be generated and can damage the component.

Unfortunately, the desirable thinness of the insulative layer of silicon oxide or other suitable insulative material in MOS components beneath the gate electrode makes this insulative layer susceptible to deleterious effects. Specifically, apertures or conductive paths therethrough can be formed, as can other forms of destruction occur, as a result of the aforementioned exposure or connection to static electric charge. Such damage renders the insulative layer permanently unsuitable for continuing service as the dielectric between gate and channel, thus effectively making the IGFET inoperative for its intended purpose.

Numerous solutions to this problem have been attempted, including surrounding and protecting components with electrically insulating materials and attempting to eliminate the voltage potential between human and component by grounding both or by some other means. Unfortunately, none of the aforementioned techniques is foolproof or even feasible for all situations. Many solutions require the redesign of MOS components themselves. In some cases, cumbersome additional components are required to filter or otherwise mitigate the harmful effects of high voltage transients. Electrical static discharge (ESD) circuits, for example, are not entirely reliable, especially for sudden, high voltage impulses, as are common with human contact. None of the prior art solutions has been totally satisfactory.

The capability of an IGFET to withstand static electric charge encountered in normal handling, without destructive effect, would be enhanced by providing supplemental static charge isolation means in association with the gate electrode. Preferably this isolation means would take the form of a transmission gate arranged in series with the normal gate of the IGFET, serving to isolate and inhibit any flow of static charge current through the insulative layer underlying the normal gate.

It would be advantageous to provide a voltage protection system in a semiconductor package to protect electronic components.

It would also be advantageous to provide a voltage protection device to protect electronic components especially from sudden voltage transients as can occur during human handling.

It would also be advantageous to provide a voltage protection system that does not require redesign of electronic components to be protected.

It would also be advantageous to provide an IGFET of improved construction having enhanced ability to withstand exposure to static electric charge encountered in normal handling.

It would also be advantageous to provide an improved IGFET of the foregoing character for use in NMOS, PMOS and CMOS applications, whose enhanced static-charge withstanding capability is secured in an economically practical fashion, and which provides improved reliability and endurance without significant sacrifice in operating efficiency and without involving undue circuit complexity.

It would also be advantageous to provide a simple system for protecting electronic components so that the manufacturing costs thereof would not be unreasonably high.

It would also be advantageous to provide a system for protecting MOS components that would require only a minimal amount of circuitry and additional components.

SUMMARY OF THE INVENTION

In accordance with the present invention, there is provided a static electricity protection system for use with a voltage sensitive MOS component having a gate input including a layer of oxide. A transmission gate having a source and a drain as an input and output, respectively, is connected to the MOS component gate input for protecting it from sudden electrical voltage surge discharges. The transmission gate source and drain include a layer of oxide substantially thicker than the oxide layer of the MOS component gate input.

BRIEF DESCRIPTION OF THE DRAWINGS

A complete understanding of the present invention may be obtained by reference to the accompanying drawings, when taken in conjunction with the detailed description thereof and in which.

DESCRIPTION OF THE PREFERRED EMBODIMENT

Figure 1:
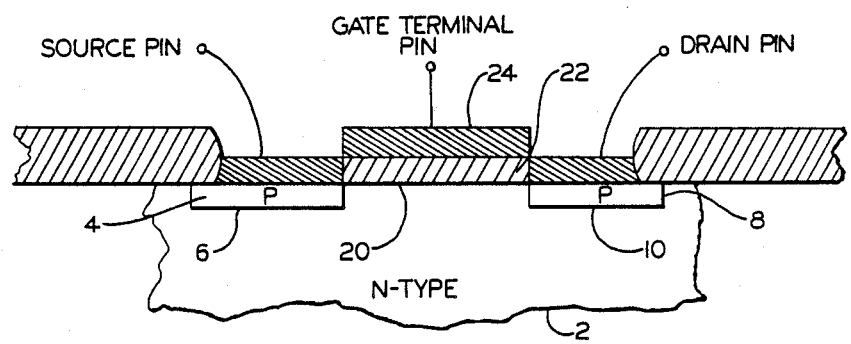
FIG. 1 is an enlarged fragmentary sectional view of one form of IGFET to which the present invention relates.

Referring now to FIGURE 1, there is shown an exemplary IGFET consisting of a semiconductor body 2 of, for example, silicon, having P-type conductivity and provided with a source region 4 of N-type conductivity delineated from body 2 by P/N junction 6 and a drain region 8 of N-type conductivity delineated from body 2 by P/N junction 10. In the region of body 2 lying between source 4 and drain 8 is channel 20. Overlying the channel 20 is the gate insulative layer or dielectric 22, sometimes called the "gate oxide", which may in fact be an oxide of silicon or a material or region including as a significant constituent an oxide of silicon such as silicon oxy-nitride or an equivalently suitable insulative dielectric layer.

Dielectric layer 22 is desirably thin, of the order usually of a few hundreds of angstroms in thickness, to insure switching of conduction through channel 20 at the requisite speeds and to ensure operation at desirably small gate voltages of the order of a volt. In turn overlying the dielectric layer 22 and capacitively coupled through it to underlying channel 20 is a gate electrode 24, which may be a plate or layer or film of metal or other suitable electrically conductive material such as low resistivity polycrystalline silicon.

Figure 2:
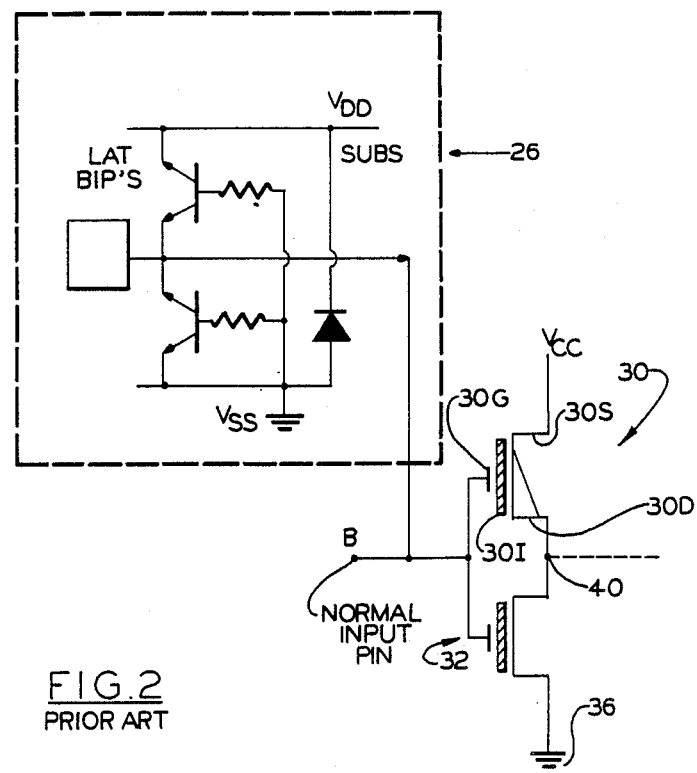
FIG. 2 is a schematic diagram of an electrical static discharge (ESD) circuit configuration of the prior art.

FIG. 2 shows, in schematic diagram form, IGFET 30 structurally similar to that detailed to FIG. 1, arranged in a simple circuit relationship between a source Vcc of supply voltage and an output terminal 40. IGFET 30 has gate 30G, source 30S, drain 30D and gate insulation 30I. Source 30S is connected to supply voltage Vcc. Drain 30D is connected to output terminal 40 and to ground terminal 36 through another similar IGFET 32.

An electrical static discharge (ESD) circuit 26 is connected to IGFET gate 30G at input terminal B and comprises conventional circuitry well known in the prior art.

In this simple circuit whose operation forms no part of the present invention, voltage Vcc is supplied to output terminal 40 when IGFET 30 is turned ON responsive to a voltage signal applied to its gate 30G, while IGFET 32 is simultaneously turned OFF.

A chronic problem with such MOS components is the electrical shorting out of inputs by static charge built up during normal handling. The weakest part of an input usually is the thin gate oxide 30I, which tends to be damaged first.

Figure 3:
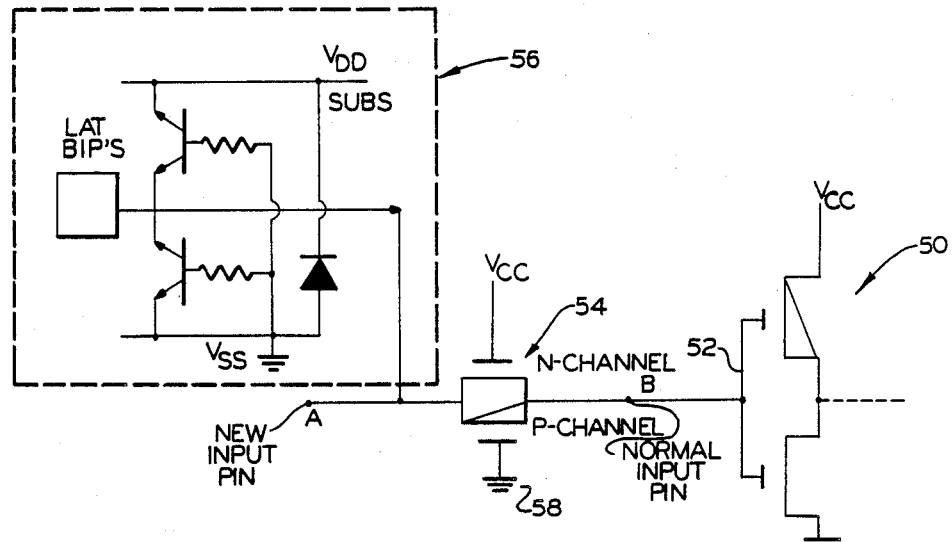
FIG. 3 is a schematic diagram of a static electricity protection system for N-channel and P-channel devices connected in parallel in accordance with the present invention.

Referring now also to FIG. 3, there is shown the circuit of the present invention. MOS component 50 is a conventional IGFET component, but connected to its gate 52 at input pin B is an N-channel in parallel with a P-channel transmission gate 54, which is a simple CMOS structure, in the preferred embodiment, to which is attached a power supply source Vcc and ground. Gate 54 thus forms an isolation stage and is arranged in series with the normal gate of IGFET 50 to be protected. Transmission gate 54 is situated between the normal input pin B for gate 52 of IGFET 50 and a supplemental or new input pin A. An ESD circuit 56 is connected to transmission gate 54 and a new input pin A for component 50 is provided before ESD circuit 56.

It has been found that the problem of electrical shorting can be prevented by providing transmission gate 54 to isolate gate input 52 from new input pin A without sacrificing significant speed die size. In other words, according to the present invention, risk of electrostatic discharge damage to the gate insulative layer of an IGFET such as IGFET 50 is substantially reduced or eliminated by providing a supplemental static charge isolation stage in association with the gate electrode 52 of IGFET 50.

Utilization of transmission gate 54 as a protective isolation device for pin B and IGFET 50 does not preclude the use, heretofore known to those skilled in the art, of conventional ESD circuits such as shown at 56, connected to pin A for shunting aside slowly applied voltage transients or otherwise lessening the likelihood of undesired voltage signals reaching the gate 52 of IGFET 50. ESD 56 is therefore used to neutralize the effect of slow voltage increases whereas transmission gate 54 has the same effect for sudden voltage transients.

Transmission gate 54 has its own NMOS gate connected to voltage supply Vcc, and PMOS gate connected to ground terminal 58. Input pin A is connected to source/drain of gate 54, which has relatively thick oxide compared to the oxide of IGFET 50. Hence, transmission gate 54 is relatively immune to, and capable of withstanding without deleterious effect, electrostatic charges which would irreparably damage the thinner gate insulative layer of IGFET 50. Thus transmission gate 54 effectively serves to isolate and protect pin B and gate 52 of IGFET 50 from the destructive effects of electrostatic charges normally encountered in handling. Yet transmission gate 54 is inexpensive and easy to include in a circuit with IGFET 50. Thus, pin A is not directly connected to gate input B, which has thin oxide. With a common 2 μ channel length CMOS process and a transmission gate 54 of 30 μ channel width, point B follows point A very closely during switching. The speed is therefore practically the same as before insertion of gate 54. Also, transmission gate 54 can be laid out such as to provide a circular source/drain, further improving input performance.

As stated above, mishandling of MOS products tends to damage input pins. The built-up static charge, if great enough, can destroy inputs of thin oxide or thick oxide even when protected by ESD circuits. The transmission gate of the present invention requires a much greater charge to damage than does a conventional gate input.

Figure 4:
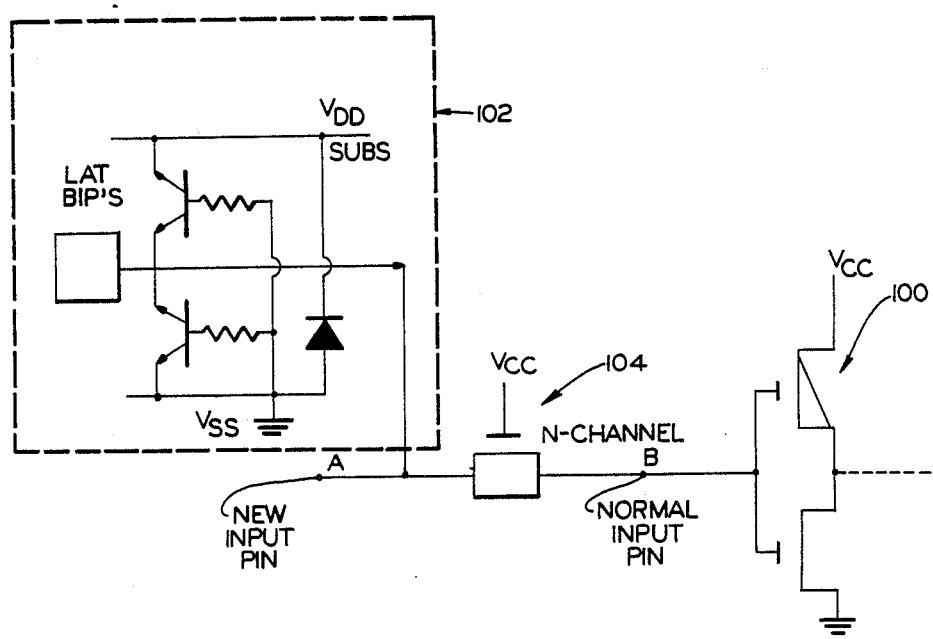
FIG. 4 is a schematic diagram of an alternate embodiment of a static electricity protection system for an N-channel device in accordance with the present invention.

Referring now also to FIG. 4, there is shown a circuit in accordance with an alternate embodiment of the present invention, similar to that shown in FIG. 3. But disposed between a conventional MOS component 100 and an ESD circuit 102 is an N-channel transmission gate 104. For different applications a simple N-channel or a simple P-channel transistor can serve the same purpose, but each device has different switching levels.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. A static electricity protection system for use with a voltage sensitive MOS component having a gate input with predetermined oxide layer thickness, the protection system comprising:
   (a) a MOS component having a gate input; and
   (b) a transmission gate having a source and a drain as an input and output, respectively, said transmission gate being connected to said MOS component gate input and having a higher voltage capacity than said MOS component for absorbing and for protecting said MOS component from sudden electrical voltage surge discharges.

2. The static electricity protection system in accordance with claim 1 wherein said transmission gate source and drain comprise a layer of oxide substantially thicker than said predetermined oxide layer of said MOS component gate input.

3. The static electricity protection system in accordance with claim 2 further comprising:
   (c) an ESD circuit connected to said gate input for slowly discharging static electricity applied thereto.

4. The static electricity protection system in accordance with claim 2 wherein said transmission gate is an N-channel device.

5. The static electricity protection system in accordance with claim 2 wherein said transmission gate is an N-channel and P-channel device connected to one another in parallel.

6. The static electricity protection system in accordance with claim 2 wherein said MOS component oxide layer thickness is approximately 250 Å.

7. The static electricity protection system in accordance with claim 6 wherein said transmission gate source and drain oxide layer thickness is approximately 3500 Å.

8. The static electricity protection system in accordance with claim 1 wherein said MOS component is a CMOS component.

* * * * *